(12) United States Patent
Lin et al.

(10) Patent No.: US 6,407,002 B1
(45) Date of Patent: Jun. 18, 2002

(54) PARTIAL RESIST FREE APPROACH IN CONTACT ETCH TO IMPROVE W-FILLING

(75) Inventors: Li-Te Lin, Hsinchu; Yuan-Hung Chiu, Taipei; Ming-Huan Tsai; Hun-Jan Tao, both of Hsin-chu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 32 days.

(21) Appl. No.: 09/636,583

(22) Filed: Aug. 10, 2000

(51) Int. Cl.⁷ .................. H01L 21/302; H01L 21/461
(52) U.S. Cl. ........................... 438/713; 438/738
(58) Field of Search .................. 438/690, 698, 438/700, 704, 712, 713, 717, 723, 724, 737, 634, 636, 637, 648, 673, 675, 738

(56) References Cited

U.S. PATENT DOCUMENTS

| | | | |
|---|---|---|---|
| 5,554,565 A | 9/1996 | Liaw et al. | 438/527 |
| 5,563,098 A | 10/1996 | Kuo et al. | 438/553 |
| 5,960,304 A * | 9/1999 | McAnally et al. | 438/587 |
| 5,985,753 A * | 11/1999 | Yu et al. | 438/637 |
| 6,025,273 A | 2/2000 | Chen et al. | 438/706 |
| 6,123,862 A * | 9/2000 | Donohoe et al. | 216/417 |
| 6,127,262 A * | 10/2000 | Huang et al. | 438/634 |
| 6,156,149 A * | 12/2000 | Cheung et al. | 156/272.2 |
| 6,174,451 B1 * | 1/2001 | Hung et al. | 216/67 |
| 6,191,030 B1 * | 2/2001 | Subramanian et al. | 438/624 |
| 6,207,554 B1 * | 3/2001 | Xu et al. | 438/624 |
| 6,271,117 B1 * | 3/2001 | Cherng | 438/624 |
| 6,211,061 B1 * | 4/2001 | Chen et al. | 438/622 |
| 6,214,721 B1 * | 4/2001 | Bendik, Jr. et al. | 438/624 |
| 6,245,699 B1 * | 6/2001 | Fu et al. | 438/624 |

OTHER PUBLICATIONS

Wolf, "Silicon Processing for the VLSI Era," vol. 2: Process Integration, Lattice Press, Sunset Beach, CA 1990, pp. 245–248.

* cited by examiner

Primary Examiner—Long Pham
Assistant Examiner—William David Coleman
(74) Attorney, Agent, or Firm—George O. Saile; Stephen B. Ackerman; Sergin Oktay

(57) ABSTRACT

A method is provided for improving the tungsten, W-filling of hole openings in semiconductor substrates. This is accomplished by forming an opening—which can be used either as a contact or via hole—with a faceted entrance along with tapered side-walls. This combination of faceted entrance and tapered side-walls improves substantially the tungsten W-filling of contact/via holes in substrates without the formation of key-holes, thereby resulting in metal plugs of high electrical integrity and high reliability.

27 Claims, 4 Drawing Sheets

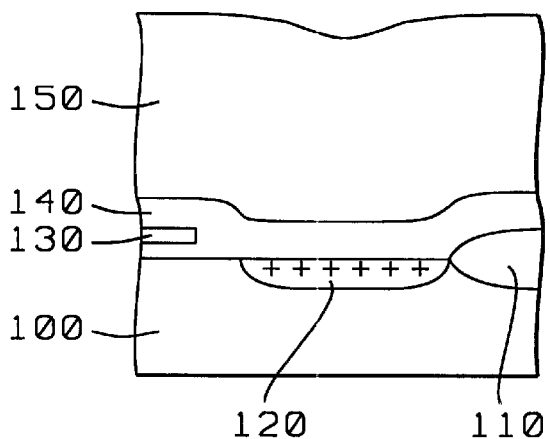
FIG. 1a - Prior Art
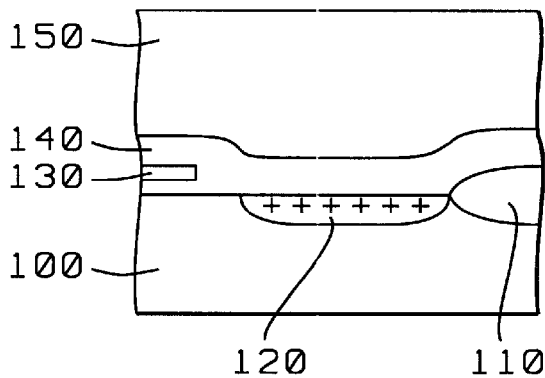
FIG. 1b - Prior Art
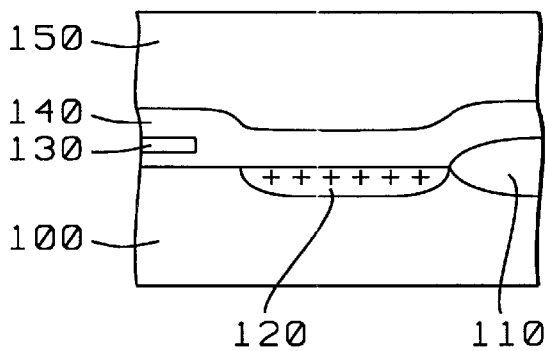
FIG. 1c - Prior Art

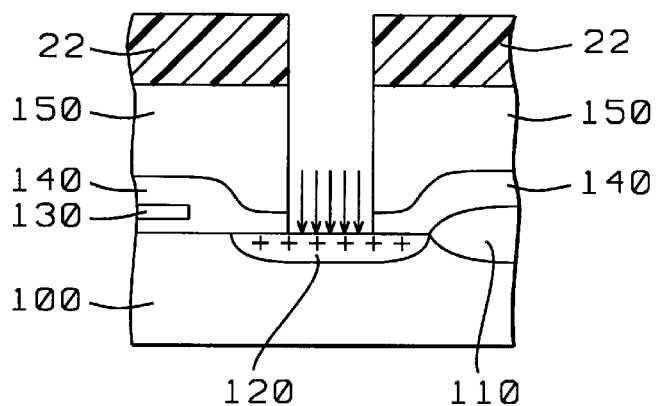
FIG. 1d – Prior Art
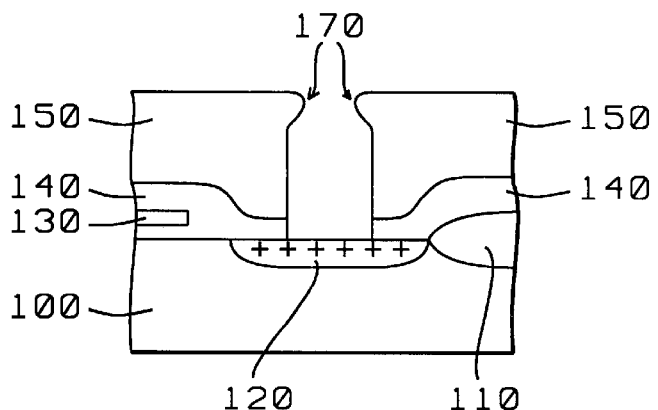
FIG. 1e – Prior Art
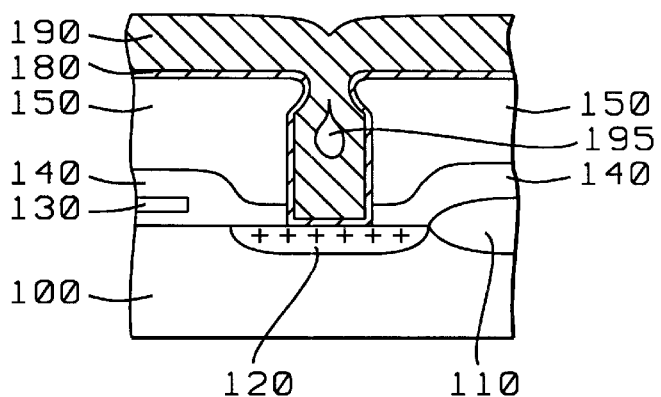
FIG. 1f – Prior Art

PARTIAL RESIST FREE APPROACH IN CONTACT ETCH TO IMPROVE W-FILLING

BACKGROUND OF THE INVENTION (1) Field of the Invention

The present invention relates to the manufacture of integrated circuits in general, and in particular, to a method of improving tungsten filling of via and contact holes through the use of partial and no resist in etching the holes.

(2) Description of the Related Art

Interconnecting devices in semiconductor substrates is posing more challenges as the miniaturization progresses from very large scale integration (VLSI) to ultra scale integration (ULSI), and, in fact, further down to feature sizes less than 0.18 micrometers ($\mu$m). As certain feature sizes become smaller, the thickness of some of the insulators cannot be scaled down accordingly because of the needed electrical strength of the insulating material. Thus, as the diameter of the vertical vias (that connect the wiring layers in a substrate) and contact holes (which reach the semiconductor substrate and provide contact to the devices within the substrate), the thickness of the insulator that separates those levels cannot be reduced at the same rate, and hence the aspect ratio, that is, the ratio of depth to the diameter of the hole, becomes larger than before.

Consequently, it is becoming more and more difficult to fill high aspect ratio, deep holes fully, that is, without voids or, what is sometimes known as "key-holes", as described below. This is true even with tungsten, which is a preferred metal for filling via and contact holes because its deposition is very conformal and results in remarkably good filling of vertical walled hole openings of relatively low aspect ratio. Also, tungsten (W) is preferred because of its low resistivity and it can be deposited at temperatures below 500° C. by chemical vapor deposition (CVD) using the hydrogen or silane reduction of tungsten hexafluoride ($WF_6$). As is known in the art, tungsten may be selectively CVD deposited into hole openings, or CVD blanket deposited as a layer and etched back to expose the metal studs or plugs in the holes. However, due to lateral encroachment and wormholes (see Wolf, S., and Tauber, R. N. "Silicon Processing for the VLSI Era," vol. 2, Lattice Press, Sunset Beach, Calif., 1990, pp. 245–248), blanket CVD W and etch back has been more widely adopted for contact hole and vial filling. Although the tungsten layer can be patterned to provide lateral wiring lines, the preferred method is to pattern the layer to expose only the studs and wire these with traditional aluminum, or, more recently, copper interconnection metallurgy. The studs are referred to as W-plugs.

A prior art process for forming W-plug contacts on a silicon wafer (100) substrate is described in U.S. Pat. No. 5,554,565 by Liaw, et al., as shown in FIGS. 1a–1f. Referring first to FIG. 1a, there is shown a cross section of a portion of a self-aligned polysilicon gate MOSFET. Shown is implant (120) representing a source or drain and the polysilicon gate (130). The silicon oxide field isolation (FOX) (110) is also shown.

A layer of dielectric material is first deposited onto the silicon surface using low-pressure-chemical-vapor-deposition(LPCVD) or plasma-enhanced-chemical-vapor-deposition(PECVD). The layer is formed by the thermal decomposition of tetraethyl orthosilicate (TEOS) at temperatures below 650° C. Doping of the layers with boron and phosphorous allows them to flow at low temperatures. In a typical application, a layer of undoped TEOS (140) is first deposited, forming silicon oxide. This is followed by a thicker layer of doped TEQS (150) which has the lower flowing temperature properties of BPSG. The initial undoped layer precludes any unwanted doping of the silicon by the BPSG.

As deposited, the surface of the BPSG layer replicates the non-planar surface of the silicon substrate. The wafer is annealed at 800 to 900° C. causing the BPSG to flow, thereby planarizing its upper surface(FIG. 1b). The BPSG is then etched back by reactive-ion-etching (RIE) to reduce its thickness but maintaining the surface planarity as shown in FIG. 1c. Photoresist (160) is applied and the contact openings are patterned using standard photolithographic techniques. RIE is then used to form the vertical contact openings in the BPSG exposing the silicon active devices (FIG. 1d).

Although the flowing of the BPSG provides a smooth upper surface, its thickness is not necessarily exactly the same over all the contact areas of the chip. The thickness depends upon the topology of the surrounding area. Thus when the contact holes are subsequently opened by RIE, some over-etching will occur at contacts where the BPSG is thinner. Since the substrate diffusions are very shallow to begin with, any over-etching could jeopardize them. Additionally, because of device miniaturization, the area of the contact approaches that of the silicon active area. A slight misalignment of the contact mask could easily cause the contact opening to miss the device implant area resulting in shorted junctions.

For these reasons an implant is made through the contact openings to reinforce the active regions of the devices (represented by the arrows in FIG. 1d). The silicon in the exposed contact areas is implanted with the appropriate dopant to provide a concentration of $2\times10^{14}$ to $2\times10^{15}$ dopant atoms/$cm^2$. Some products may require only one type of contact. For example, in NMOS technology the (100) diffused contacts can be entirely of n-type. Here, the appropriate implant may be performed without masking. For complimentary MOS(CMOS) technology, where both n- and p-type contacts are required, a first implant of p-type dopant is directed at all contacts. Then the p-type contacts are covered with a photoresist block-out mask and the n-contacts are implanted with a higher dose of n-type dopant to over-compensate the previous p-type implant. Using this procedure eliminates the need for an additional photolithographic step to shield the n-contacts.

Under the conventional procedure, these contact implants are next activated by rapid-thermal-annealing(RTA). This causes the BPSG to flow at the upper edge (170) (FIG. 1e) and severely encroach into the contact opening if the anneal temperature is above 950° C. A Ti/TiN barrier metallization (180) (FIG. 1f) is then deposited and a barrier annealing is performed between 550 and 700° C. to secure a bond of the Ti to the silicon and to the BPSG. Finally a layer of CVD tungsten (190) is deposited to fill the contact opening. The encroachment of the BPSG into the contact opening causes a restriction to the filling of the contact hole by the tungsten (190) leaving a void, or, key-hole, (195) in the center. Depending upon the degree of the overhang and the size of the contact opening, the thin tungsten walls surrounding the void have the potential for subsequent electrical failure.

In order to alleviate this potential electrical failure, Liaw, et al., propose an improved method for the fabrication of an ohmic, low resistance contact to heavily doped silicon by using a CVD deposited tungsten plug provided with Ti/TiN barrier metallurgy. The method provides for surface planarization by depositing first a layer of silicon oxide followed by a layer of borophosphosilicate glass onto a silicon wafer containing integrated circuit devices. After the glass is thermally flowed to planarize its surface, it is etched back to a suitable thickness and a second layer of silicon oxide is deposited over the now-planar surface. Contact holes are patterned in the composite silicon oxide-glass-silicon oxide structure and the exposed silicon device contacts are ion-implanted. The implant is then activated by rapid-thermal-annealing. The presence of the second silicon oxide layer prevents the upper corners of the contact openings from flowing and encroaching into the opening as would occur in its absence. This provides for void-free filling of the contact openings by the tungsten contact deposition.

In another approach, Chen, et al., of U.S. Pat. No. 6,025,273 disclose a method for etching reliable small contact holes in an interlevel dielectric (ILD) layer with improved profiles for semiconductor integrated circuits using a carbon doped hard mask. The method increases the ILD etch rate while reducing residue build-up on the contact hole sidewall. This provides a process for making contact holes smaller than 0.25 $\mu$m in width. After depositing the ILD layer over the partially completed integrated circuit which includes patterned doped first polysilicon layers, a second polysilicon layer is deposited and doped with carbon by ion implants-lion. A photoresist mask is used to etch openings in the carbon doped polysilicon layer to form a hard mask. The photoresist is removed, and the contact holes are plasma etched in the ILD layer while free carbon released from the hard mask, during etching, reduces the free oxygen in the plasma. This results in an enhanced fluorine etch rate for the contact holes in the ILD layer and reduces the residue build-up on the sidewalls of the contact holes. The hard mask is anneal in $O_2$ to form an oxide layer and any surface carbon is removed in a wet etch. Reliable metal plugs is formed by depositing a barrier layer, such as titanium (Ti) or titanium nitride (TiN) and a metal such as tungsten (W) and etching back or chemical/mechanical polishing back to the oxide layer.

A poly mask approach is taught by Kuo, et al., in U.S. Pat. No. 5,563,098 to form buried contact holes. A layer of silicon oxide is provided overlying a semiconductor substrate. A layer of polysilicon is deposited overlying the silicon oxide layer. The polysilicon layer is covered with a layer of photoresist which is exposed and developed to provide a photoresist mask. The polysilicon layer is etched away where it is not covered by the photoresist mask wherein a polymer buildup is formed on the sidewalls of the polysilicon layer. Ions are implanted into the silicon oxide layer not covered by the photoresist mask. The photoresist mask is removed whereby the polymer buildup is also removed. Thereafter, the silicon oxide layer not covered by the polysilicon layer is etched away to complete the formation of the buried contact hole with reduced polymer buildup in the fabrication of an integrated circuit.

The present invention discloses a method of W-filling deep vias and contact holes without the commonly encountered void, or, key-hole, problem. This is accomplished by the etching of the via or contact hole with a judicious use of a partial resist and no resist during the etching of the hole opening.

SUMMARY OF THE INVENTION

It is therefore an object of the present invention to provide a method of improving tungsten-filling of a hole opening without the presence of voids or key-holes in order to improve the over-all reliability of metal vias and contacts in a semiconductor substrate.

It is another object of the present invention to provide a method of improving tungsten (W)-filling of a hole opening in a semiconductor substrate by using a hard dielectric anti-reflective coating (DARC) mask.

It is still another object of the present invention to provide a method of improving W-filling of a hole opening in a substrate by using a photoresist mask first, and then a hard mask comprising a DARC layer during the etching of the hole opening.

It is yet another object of the present invention to provide a method of improving W-filling of a hole opening in a substrate by using a first main-etch (ME) with a photoresist mask, and then a second ME with a hard mask during the etching of the hole opening.

It is still another object of the present invention to provide a faceted via/contact hole with tapered side-walls in order to form metal plugs without the presence of key-holes.

These objects are accomplished by providing a semiconductor substrate having a substructure of devices formed therein; forming an etch-stop liner over said substrate; forming an interlevel dielectric (ILD) layer over said etch-stop layer; forming a dielectric anti-reflective coating (DARC) layer over said ILD layer; forming a patterned resist-mask over said DARC layer; performing DARC etch through said resist-mask to form a DARC hard-mask; performing a first main-etch (ME) through said resist-mask to form a partial opening in said ILD layer; removing said resist-mask; performing a second ME through said DARC hard-mask to form a via/contact hole with a taper in said ILD layer until said etch-stop liner is reached at the bottom of said via/contact hole opening while at the same time said via/contact hole opening in said DARC layer is faceted; removing said etch-stop liner at the bottom of said hole opening until substrate surface is reached; forming metal plug in said hole opening; and removing any excess metal from the surface of said substrate.

These objects are further accomplished by providing a semiconductor substrate; a hole opening in said substrate; and said hole opening having a faceted entrance and tapered side-walls.

BRIEF DESCRIPTION OF THE DRAWINGS

FIG. 1a is a cross-sectional view of a portion of a semiconductor substrate showing the forming of undoped and doped TEOS layers, according to prior art.

FIG. 1b is a cross-sectional view of a portion of the substrate of FIG. 1a, showing the reflowing of the upper doped TEOS layer, according to prior art.

FIG. 1c is a cross-sectional view of a portion of the substrate of FIG. 1b, showing the etch back of the top layer, according to prior art.

FIG. 1d is a cross-sectional view of a portion of the substrate of FIG. 1c, showing the etching of a hole opening, and the implantation of the substrate through the same hole, according to prior art.

FIG. 1e is a cross-sectional view of a portion of the substrate of FIG. 1d, showing the forming of the bulbous nodules at the edge of the opening after the activation of the implantation through rapid thermal annealing, according to prior art.

FIG. 1f is a cross-sectional view of a portion of the substrate of FIG. 1e, showing the forming of a void, or, key-hole, in the metal plug after the deposition of the metal into the opening having edge nodules, according to prior art.

DESCRIPTION OF THE PREFERRED EMBODIMENTS

Figure 2A:
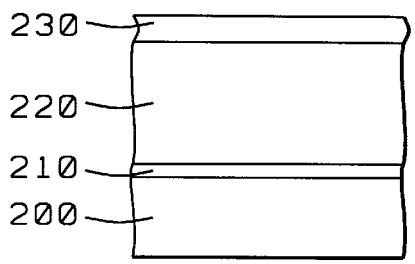
FIG. 2a is a cross-sectional view of a portion of a semiconductor substrate showing the forming of an etch-stop liner, an interlevel dielectric layer (ILD) and a dielectric anti-reflective coating (DARC) layer, in that order, as currently practiced in the present manufacturing line.

Referring now to the drawings, in particular to FIGS. 3a–3f, there is shown a method of forming a tungsten plug in a contact hole without the detrimental effects of having a void or a key-hole that is usually found in prior art plugs. The method involves the performing of the currently used main etch with and without a resist-mask in the opening of a contact hole. That is, the currently used main etch step is split up into two steps whereby during the first main etch step, a resist-mask is used to form an opening in a dielectric anti-reflective coating (DARC) layer, and then, after the removal of the resist-mask, the DARC layer itself is used as a hard-mask to form a tapered contact hole in the underlying interlevel dielectric as the DARC layer is also faceted. In other words, the main etch is performed with and without a, or, with no, resist-mask. It is this faceted DARC layer and the tapered contact hole that enable the forming of a metal plug in the contact hole without any key-holes. It will be appreciated by those skilled in the art that the disclosed method is also applicable to forming tungsten plugs in holes between metal layers, what are known as via holes, as well.

Thus, a main feature and key aspect of the present invention is the tapering of the straight walls of the presently formed contact/via holes, in addition to the use of a faceted DARC layer at the mouth of the hole. The faceted DARC layer is very important in eliminating the key-holes. However, faceted DARC alone does not always prevent the forming of key-holes, as currently practiced in the present manufacturing line. FIGS. 2a–2f show an instance of the forming of a key-hole when faceted DARC layer is used in the absence of tapered contact/via hole.

The faceted opening to a via/contact hole is found to be especially effective in preventing the forming of metal nodules, or, over-hangs, as they are sometimes called, in contrast to dielectric nodules. That is, the formation of nodules (170) shown in FIGS. 1e and 1f is not unique to dielectrics only. Just as dielectric nodules can form during rapid-thermal-annealing, metal nodules, or, metal overhang, can occur while depositing metal into straight-walled, vertical contact holes. Thus, FIGS. 2a–2f show the forming of such metal nodules, and, sometimes, the subsequent formation of a key-hole in a straight-walled contact hole as currently practiced in the present manufacturing line. The claimed process steps of FIGS. 3a–3f, on the other hand, where faceted DARC opening is coupled with the tapered contact/via hole, eliminate totally the formation of any key-holes, as disclosed later in the embodiments of the present invention.

More specifically, in FIG. 2a, substrate (200), preferably silicon, is provided with a substructure of devices and/or metal layer formed within and thereon, capped with a layer of an etch-stop liner (210). It is preferred that the liner comprises silicon nitride, silicon oxynitride, silicon carbide with varying amounts of silicon concentration formed by chemical vapor deposition (CVD), or plasma enhanced CVD (PECVD) methods to a thickness between about 200 to 500 Å.

Dielectric layer (220) is next formed over the etch-stop liner; as an interlevel dielectric (ILD) layer if it is the first level between the gate and the first metal layer, or as an intermetal dielectric (IMD) layer, if it is a layer between metal layers in the substrate. It will be apparent to those skilled in the art that the present invention is applicable to both the vertical via metal plugs that are formed in an IMD layer between the metal layers, and to a metal contact plug formed within an ILD layer to contact the semiconductor substrate. However, the term ILD will be used generically to refer to both cases.

Forming dielectric layers are known in the art. Blanket dielectric layers may be formed from materials including but not limited to silicon oxide materials, silicon nitride materials, and silicon oxynitrides materials formed within integrated circuits through methods including but not limited to PECVD or, spin-on methods. Preferably, the dielectric layer comprises oxides with varying doping levels of phosphorous or boron, including BPTEOS, TEOS, PSG, BPSG, and has a thickness between about 4000 to 7000Å.

Next, as an important aspect of the present practice as well as that of the claimed method of the present invention, a dielectric anti-reflective (DARC) layer is formed over the ILD layer. It is preferred that DARC layer (230) shown in FIG. 2a comprises silicon oxynitride with varying amounts of silicon concentration, and has a thickness between about 600 to 1600 Å. DARC layer can serve as a hard mask in etching a hole opening in the ILD layer and provides the means for better control of critical dimensions (CD) while etching. Furthermore, DARC does not readily form bulbous nodules at the mouth of the hole opening during the etching process, and hence voids are avoided to a large extent.

Figure 2B:
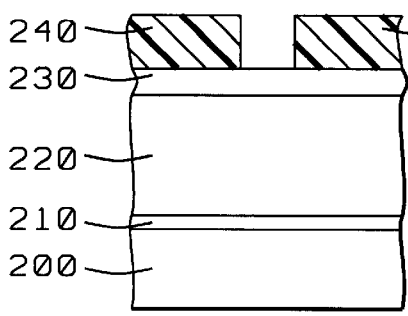
FIG. 2b is a cross-sectional view of a portion of the substrate of FIG. 2a, showing the forming of a photoresist layer and the patterning of the same to form a resist-mask, as currently practiced in the present manufacturing line.
Figure 2C:
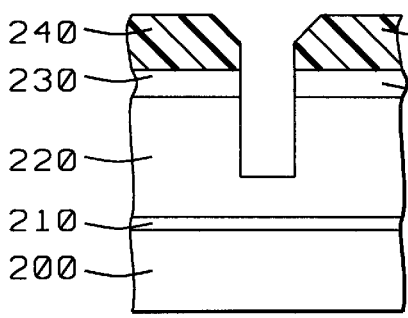
FIG. 2c is a cross-sectional view of a portion of the substrate of FIG. 2b, showing the etching through the resist-mask to form an opening in the DARC and in the underlying ILD, as currently practiced in the present manufacturing line.

After the forming of the DARC layer, photoresist layer (240) is formed and patterned with the hole opening that is required (via or contact) in the ILD layer (FIG. 2b). The preferred thickness of the photoresist mask, or, resist-mask, is between about 4000 to 6000 Å. Using the resist-mask, a hole opening is formed in the DARC layer and further into the ILD layer, as shown in FIG. 2c with a recipe comprising $CF_4/Ar/O_2$ or $CHF_3/Ar/O_2$ chemistry at a power range between about 1200 to 1800 watts, and pressure between about 40 to 60 millitorr (mT).

Figure 2D:
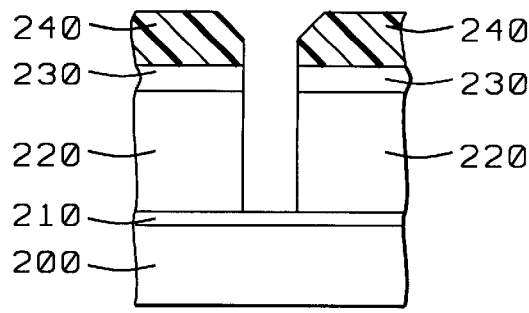
FIG. 2d is a cross-sectional view of a portion of the substrate of FIG. 2c, showing the performing of the first ME in extending the hole in the ILD—without any dielectric overhang due to the presence of the DARC layer—until the etch-stop liner is reached, as currently practiced in the present manufacturing line.
Figure 2E:
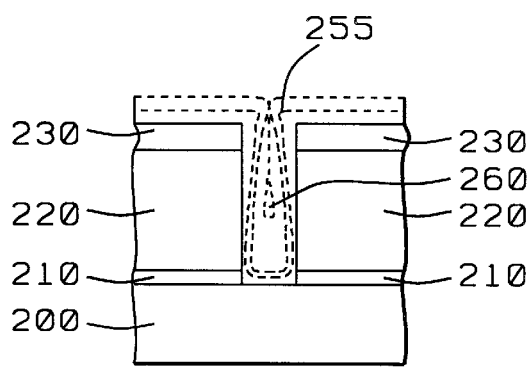
FIG. 2e is a cross-sectional view of a portion of the substrate of FIG. 2d, showing the removal of the etch-stop liner at the bottom of the hole opening, and the subsequent filling of the opening with metal, as currently practiced in the present manufacturing line.
Figure 2F:
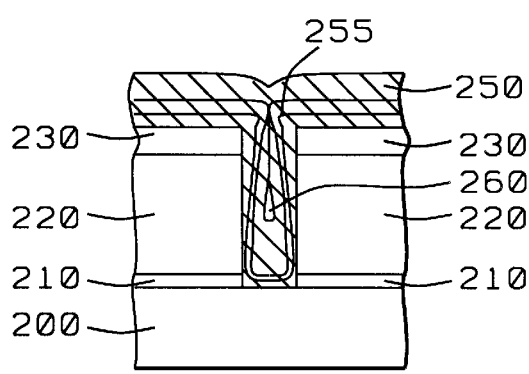
FIG. 2f is a cross-sectional view of a portion of the substrate of FIG. 2e, showing the forming of a metal plug, and the occasional forming of metal overhang at the mouth of the opening in the absence of any faceting or tapering of the side-walls, as currently practiced in the present manufacturing line.

Then, as a key aspect of the present invention, a first part of the main-etch (ME) is performed until etch-stop layer (210) is reached, as shown in FIG. 2d. Subsequently, the resist-mask is removed, preferably by oxygen plasma ashing. Next, and following the key aspect of the invention, the second ME is performed, in order to remove layer (210) until substrate surface (200) is reached. It will be noted that in this currently practiced method, the walls of the via/contact hole are still vertical, without any taper, while the mouth of the opening is only slightly faceted in the DARC layer, as shown in FIG. 2e. Thus, when, at the next step, the opening is filled with metal (250), as shown in the same FIG. 2e, the metal deposits form protrusions, or, metal nodules and over-hangs (255), which in turn can sometimes cause key-holes such as shown by reference numeral (260), even in the absence of dielectric nodules due to the presence of the DARC layer. Preferably the metal comprises tungsten with a thickness between about 5000 to 8000 Å. Any excess metal can be then removed by chemical-mechanical polishing (CMP), or, by using any one of conventional etch back techniques to expose the tungsten plug in the hole opening in preparation for the subsequent steps of completing the interconnect process.

In the preferred embodiment shown in FIGS. 3a–3f, the key-hole void formation is completely prevented, because the mouth of the hole opening is widened with a full facet so that the metal fill is accomplished with ease, and without any protrusions, or nodules, to cause key-holes. Furthermore, the via/contact hole profile is changed substantially through tapering that is performed during the second main-etch of the present invention.

Figure 3A:
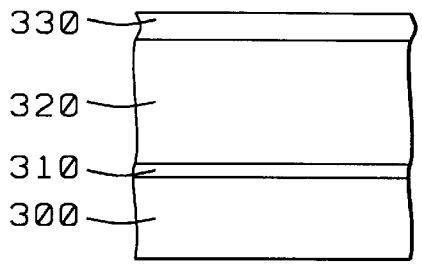
FIG. 3a is a cross-sectional view of a portion of a semiconductor substrate showing the forming of an etch-stop liner, an interlevel dielectric layer (ILD) and a dielectric anti-reflective coating (DARC) layer, in that order, according to the second embodiment of the present invention.

Thus, in FIG. 3a, substrate (300), preferably silicon, is provided with a substructure of devices and/or metal layer formed within and thereon, capped with a layer of an etch-stop liner (310). It is preferred that the liner comprises silicon nitride, silicon oxynitride, silicon carbide with varying amounts of silicon concentration formed by chemical vapor deposition (CVD), or plasma enhanced CVD (PECVD) methods to a thickness between about 200 to 500 Å.

Figure 3B:
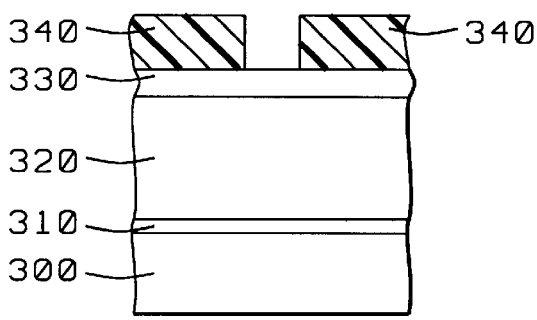
FIG. 3b is a cross-sectional view of a portion of the substrate of FIG. 3a, showing the forming of a photoresist layer and the patterning of the same to form a resist-mask, according to the present invention.

ILD layer (320) is next formed over the etch-stop liner. Preferably, the dielectric layer comprises oxide with varying doping levels of phosphorous or boron, and has a thickness between about 4000 to 7000 Å. Next, a dielectric anti-reflective (DARC) layer is formed over the ILD layer. It is preferred that DARC layer (330) shown in FIG. 3a comprises silicon oxynitride with varying silicon concentration, and has a thickness between about 600 to 1600 Å. After the forming of the DARC layer, photoresist layer (340) is formed and patterned with the hole opening that is required (via or contact) in the ILD layer (FIG. 3b). The preferred thickness of the photoresist mask is between about 4000 to 6000 Å.

Subsequently, following the main feature and key aspect of the preferred embodiment of the present invention, the main-etch (ME) is split and performed in two steps. This is because, the first ME is performed by using the photoresist as a resist-mask and the second ME is performed without the resist-mask. That is, the disclosed best mode teaches the forming of a void-free tungsten plug by first using the resist-mask partially to form the hole opening, and then completing the etching of the hole opening without the resist-mask (the free resist approach during contact etching), but with the hard mask provided by the DARC layer. It should be noted that the first and second main-etch can be the same or of different recipes with different etch-time ratios, as required by the faceted slope of the DARC edge and the hole opening at the top of the via/contact holes, depending upon the metal used for filling the hole.

Figure 3C:
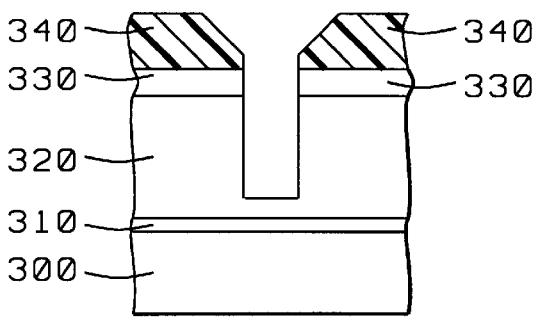
FIG. 3c is a cross-sectional view of a portion of the substrate of FIG. 3b, showing the etching through the resist-mask to form an opening in the DARC and in the underlying ILD, according to the present invention.
Figure 3D:
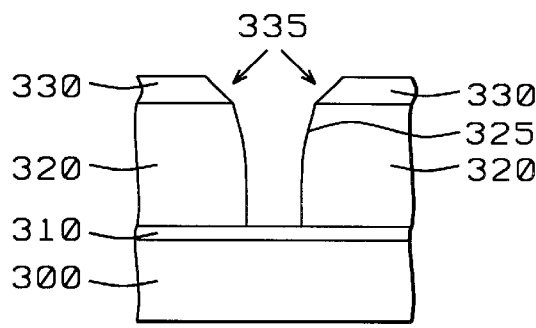
FIG. 3d is a cross-sectional view of a portion of the substrate of FIG. 3c, showing the removal of the resist-mask and the performing of a first ME to extend the opening of the hole pattern into the ILD, while, using the DARC pattern—free of any overlying resist-mask—as a hard mask and at the same time forming a faceted entrance over the hole opening, and tapering the walls of the opening, according to the present invention.
Figure 3E:
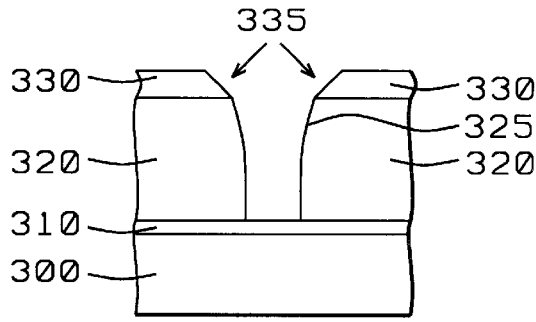
FIG. 3e is a cross-sectional view of a portion of the substrate of FIG. 3d, showing the removal of the etch-stop liner from the bottom of the hole opening, and further faceting the entrance and further tapering the side-walls of the opening, according to the present invention.

Thus, first ME is performed with the resist-mask in place, as shown in FIG. 3c. It is preferred that the first ME recipe comprises $C_4F_8/Ar/CO/O_2$ chemistry at a power range between about 1200 to 1800 watts, and pressure between about 40 to 60 mT. It will be noted that the first ME removes some portions of the photoresist layer at the mouth of the opening, and transfers the hole pattern into the DARC layer as well as, well into the ILD layer. Then, the photoresist mask is removed, preferably by oxygen plasma ashing, and a second ME is performed. The second ME is accomplished with a recipe comprising $C_4F_8/Ar/CO/O_2$ chemistry at a power range between about 1200 to 1800 watts, and pressure between about 40 to 60 mT. It will be noted that the second ME removes some portions of the DARC layer at the mouth of the opening, while at the same time tapering the straight vertical walls of the via/contact-hole and reaching the etch-stop liner at the bottom of the desired hole opening. It is important that the second main-etch is timed to control the faceting (335) and slope angle at the top of the hole opening, as well as along the walls (325) of the hole opening. After the faceting of the DARC, and the tapering of the via/contact hole, etch-stop liner (310) at the bottom of the hole opening is removed using a recipe comprising $CH_2F_2/O_2/Ar$ or $CH_3F_3/O_2/Ar$ chemistry with a power range between about 250 to 500 watts, and pressure between about 30 to 50 mT.

Figure 3F:
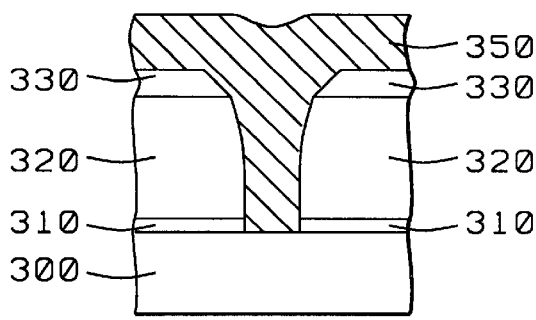
FIG. 3f is a cross-sectional view of a portion of the substrate of FIG. 3e, showing the forming of a metal plug without any metal overhang or a key-hole due to the presence of the faceting at the entrance to the opening and tapering along the side-walls of the opening, according to the present invention.

As a penultimate step, the opening is filled with metal, as shown in FIG. 3f. Preferably the metal comprises tungsten with a thickness between about 5000 to 8000 Å. It will be noted that with the faceted DARC layer and tapered sidewalls, the problem of void formation is avoided. Any excess metal can be then removed by chemical-mechanical polishing (CMP), or, by using any one of conventional etch back techniques to expose the tungsten plug in the hole opening in preparation for the subsequent steps of completing the interconnect process.

Though these numerous details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, for example, forming via holes instead of contact holes, and using different etch recipes to obtain the desired slope angle of the faceted edge of the hole, or different etch selectivities to photoresist and etch-stop liner.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of using photoresist selectively in via/contact etch to improve W-filling of an opening in a substrate comprising the steps of:

providing a semiconductor substrate having a substructure of devices formed therein;

forming an etch-stop liner over said substrate;

forming an interlevel dielectric (ILD) layer over said etch-stop layer;

forming a dielectric anti-reflective coating (DARC) layer over said ILD layer;

forming a patterned resist-mask over said DARC layer;

performing DARC etch through said resist-mask to form a DARC hard-mask;

performing a first main-etch (ME) through said resist-mask to form a partial opening in said ILD layer;

removing said resist-mask;

performing a second ME through said DARC hard-mask to form a via/contact hole with a taper in said ILD layer until said etch-stop liner is reached at the bottom of said via/contact hole opening while at the same time said via/contact hole opening in said DARC layer is faceted;

removing said etch-stop liner at the bottom of said hole opening until substrate surface is reached;

forming metal plug in said hole opening; and removing any excess metal from the surface of said substrate.

2. The method of claim 1, wherein said etch-stop liner comprises silicon nitride, silicon oxynitride and silicon carbide having a thickness between about 200 to 500 Å.

3. The method of claim 1, wherein said ILD layer comprises oxides with varying concentrations of phosphorous and boron, including BPTEOS, TEOS, PSG, BPSG.

4. The method of claim 1, wherein said ILD layer has a thickness between about 4000 to 7000 Å.

5. The method of claim 1, wherein said DARC layer comprises silicon oxynitride.

6. The method of claim 1, wherein said DARC layer has a thickness between about 600 to 1600 Å.

7. The method of claim 1, wherein said resist-mask has a thickness between about 4000 to 6000 Å.

8. The method of claim 1, wherein said DARC etch comprises $CF_4/Ar/O_2$ or $CHF_3/Ar/O_2$ chemistry at a power range between about 1200 to 1800 watts, and pressure between about 40 to 60 millitorr (mT).

9. The method of claim 1, wherein said first ME to form said hole opening in said ILD is accomplished with a recipe comprising $C_4F_8/Ar/CO/O_2$ chemistry at a power range between about 1200 to 1800 watts, and pressure between about 40 to 60 mT.

10. The method of claim 1, wherein said second ME to form said tapered via/contact hole opening while at the same time said via/contact hole opening in said DARC layer is faceted is accomplished with a recipe comprising $C_4F_8/Ar/CO/O_2$ at a power level between about 1200 to 1800 watts, and pressure between about 40 to 60 mT.

11. The method of claim 1, wherein said removing said etch-stop liner is accomplished with a recipe comprising $CH_2F_2/O_2/Ar$ or $CH_3F_3/O_2/Ar$ chemistry with a power range between about 250 to 500 watts, and pressure between about 30 to 50 mT.

12. The method of claim 1, wherein said forming said metal plug in said opening is accomplished by depositing tungsten.

13. The method of claim 1, wherein said removing said excess metal is accomplished by chemical-mechanical polishing (CMP).

14. A method of forming a metal plug in a via/contact hole with a faceted entrance and tapered walls to improve W-filling comprising the steps of:

providing a semiconductor substrate having a substructure of devices formed therein;

forming an interlevel dielectric (ILD) layer over said substrate;

forming a dielectric anti-reflective coating (DARC) layer over said ILD layer;

forming an opening having an entrance in said DARC layer and an extension hole with side-walls in said ILD layer;

faceting said entrance in said DARC layer, and tapering said extension hole to have tapered side-walls in said ILD layer; and forming metal plug in said opening with said faceted entrance and said tapered side-walls.

15. The method of claim 14, wherein said ILD layer has a thickness between about 4000 to 7000 Å.

16. The method of claim 14, wherein said DARC layer comprises oxynitride.

17. The method of claim 14, wherein said DARC layer has a thickness between about 600 to 1600 Å.

18. The method of claim 14, wherein said entrance in said DARC layer is formed using a resist-mask and a recipe comprising $CF_4/Ar/O_2$ or $CHF_3/Ar/O_2$ chemistry at a power range between about 1200 to 1800 watts, and pressure between about 40 to 60 millitorr (mT).

19. The method of claim 14, wherein said forming said extension hole is accomplished with a recipe comprising $C_4F_8/Ar/CO/O_2$ chemistry at a power range between about 1200 to 1800 watts, and pressure between about 40 to 60 mT.

20. The method of claim 14, wherein said tapering said extension hole in said ILD layer is accomplished by using DARC layer as a hard-mask without the presence of said resist-mask with a recipe comprising $C_4F_8/Ar/CO/O_2$ at a power level between about 1200 to 1800 watts, and pressure between about 40 to 60 mT.

21. The method of claim 14, wherein said forming said metal plug is accomplished by depositing tungsten into said via/contact hole having said entrance opening and said extension hole.

22. A faceted via/contact hole with tapered side-walls comprising:

provide a semiconductor substrate;

a hole opening in said substrate; and said hole opening having a faceted entrance and tapered side-walls.

23. The faceted via/contact hole of claim 24, wherein said DARC comprises oxynitride.

24. The faceted via/contact hole of claim 22, wherein said DARC has a thickness between about 600 to 1600 Å.

25. The faceted via/contact hole of claim 22, wherein said faceted entrance has a slope angle between about 70 to 85 degrees.

26. The faceted via/contact hole of claim 22, wherein said tapered walls have a slope angle between about 45 to 75 degrees.

27. The faceted via/contact hole of claim 22, wherein said faceted entrance comprises a dielectric anti-reflective coating (DARC).

* * * * *

UNITED STATES PATENT AND TRADEMARK OFFICE
CERTIFICATE OF CORRECTION

PATENT NO. : 6,407,002 B1
DATED : June 18, 2002
INVENTOR(S) : Li-Te Lin, Yuan-Hung Chiu, Ming-Huan Tsai and Hun-Jan Tao It is certified that error appears in the above-identified patent and that said Letters Patent is hereby corrected as shown below:

<u>Title page,</u>
Item [74], *Attorney, Agent, or Firm,* please delete "Sergin Oktay", and replace with -- Sevgin Oktay --.

Signed and Sealed this

Fourteenth Day of January, 2003

JAMES E. ROGAN
*Director of the United States Patent and Trademark Office*